United States Patent [19]

Beling et al.

[11] Patent Number: 5,001,425

[45] Date of Patent: Mar. 19, 1991

[54] FERROMAGNETIC OBJECT DETECTOR WITH COMPARISON OF SIGNAL MAXIMUMS FROM A PAIR OF DETECTION COILS

[75] Inventors: Thomas E. Beling, Framingham, Mass.; Wayne M. Spani, San Diego, Calif.

[73] Assignee: Winfield Corporation, San Diego, Calif.

[21] Appl. No.: 450,320

[22] Filed: Dec. 13, 1989

[51] Int. Cl.$^5$ .............. G01R 33/12; G01N 27/72; G08B 21/00

[52] U.S. Cl. .............. 324/239; 209/549; 324/243; 324/260; 340/568

[58] Field of Search .............. 324/178, 179, 228, 234, 324/239–243, 258, 260, 326–329, 345; 209/546, 549, 562–564, 567; 340/568

[56] References Cited

U.S. PATENT DOCUMENTS

| | | | |
|---|---|---|---|
| 2,369,659 | 2/1945 | Carr | 324/178 |
| 2,680,226 | 6/1954 | Whitehead et al. | 324/326 |
| 3,065,412 | 11/1962 | Rosenthal | 324/239 |
| 3,165,691 | 1/1965 | McClanahan | 324/239 X |
| 3,397,364 | 8/1968 | Crandall | 331/65 |
| 4,024,468 | 5/1977 | Hirschi | 324/3 |
| 4,030,026 | 6/1977 | Payne | 324/3 |
| 4,110,679 | 8/1978 | Payne | 324/3 |
| 4,128,803 | 12/1978 | Payne | 324/3 |
| 4,325,027 | 4/1982 | Dykstra et al. | 324/329 |
| 4,486,710 | 12/1984 | Schmidt | 324/179 |
| 4,486,713 | 12/1984 | Gifford | 324/329 |
| 4,742,339 | 5/1988 | Baziuk | 324/228 X |

Primary Examiner—Gerard R. Strecker
Attorney, Agent, or Firm—Nydegger & Associates

[57] ABSTRACT

A device for detecting the passage of a ferromagnetic object through a predetermined space has a substantially circular base which circumscribes the space. An inner detector coil and an outer detector coil are concentrically mounted in coplanarity on the base. Voltages are induced on the coils in response to the passage of a nearby magnetic field, such as the small permanent magnetic field associated with a ferromagnetic object. A signal processing circuit compares the induced voltages on the coils to indicate passage of a metal object through the circumscribed space when the inner coil voltage exceeds the outer coil voltage.

28 Claims, 2 Drawing Sheets

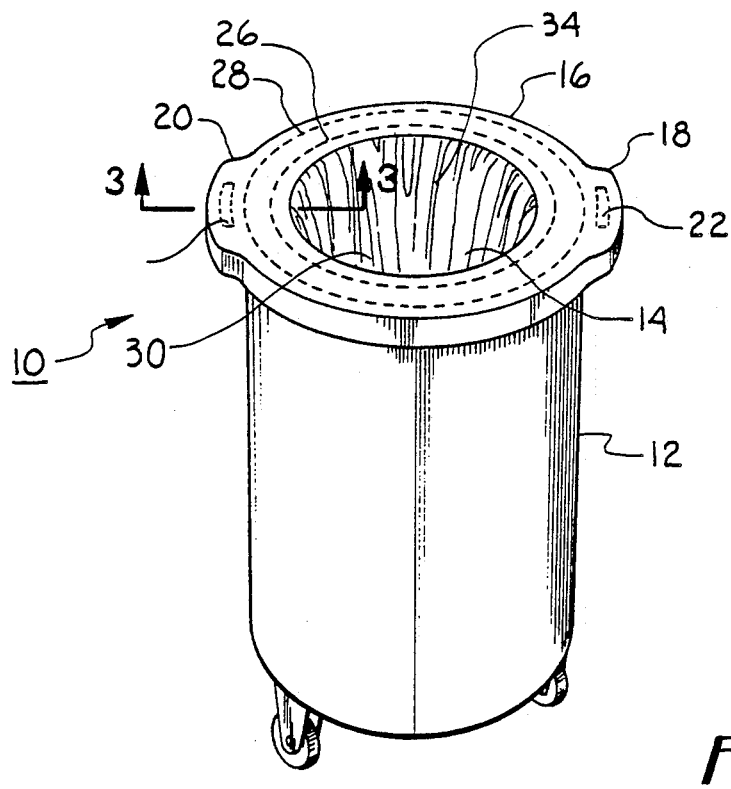
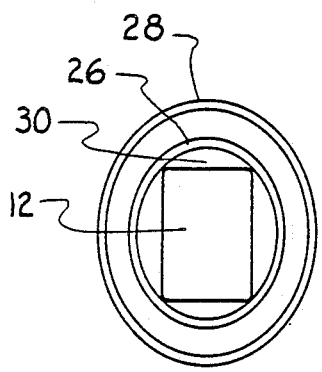
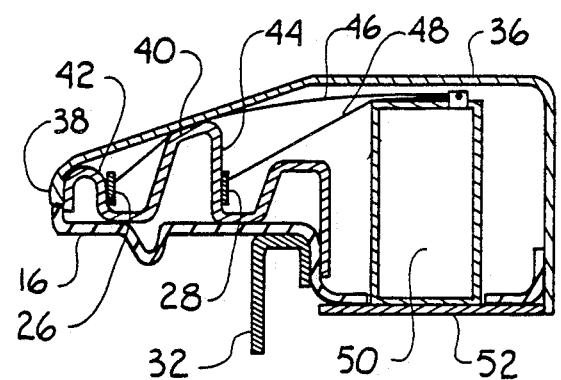

FERROMAGNETIC OBJECT DETECTOR WITH COMPARISON OF SIGNAL MAXIMUMS FROM A PAIR OF DETECTION COILS

FIELD OF THE INVENTION

This invention relates generally to metal detectors. More specifically, the present invention relates to metal detectors which are useful for determining the passage of a metal object through a predetermined circumscribed space. This invention is particularly, but not exclusively, suited for use as a detector which can be mounted over an opening of a receptacle for determining when ferromagnetic objects have been placed into the receptacle.

BACKGROUND OF THE INVENTION

Metal detectors of various configurations are well known and have been successfully used in many diverse applications. For example, metal detectors have become commonplace at airports and other places where the smuggling of firearms, bombs and other dangerous metal objects must be detected. Metal detectors are also commonly used in prospecting and numerous other activities which require the location of lost or unseen metal objects. The detectors used for these purposes, however, are typically sophisticated and complicated devices which are relatively difficult to manufacture, operate and maintain.

In the medical field, there is a particular need for controlling the inadvertent loss of surgical and medical instruments which the present invention recognizes can be accomplished by using a metal detector. Not just any metal detector will suffice for this purpose, however, because most of these losses occur when the instruments are inadvertently discarded along with used bandages, contaminated articles, or soiled linens and clothing. Unfortunately, these losses can be quite costly.

Obviously, the most effective place to detect the inadvertent disposal of surgical and medical instruments is at the point where waste is being collected. Typically, in hospitals, this occurs at hampers and receptacles which are located at various sites throughout the hospital. Moreover, these hampers and receptacles need, at times, to be moveable in order to satisfy the efficiency requirements of the hospital. Further, the detection of discarded surgical and medical instruments should be accomplished without undue disruption of the hospital's routine. For example, it is desirable that the metal detector not yield false alarms when certain non-ferrous materials are discarded, such as aluminum wrapping used for containing certain hospital supplies.

The present invention recognizes that a metal detector can be provided which is operatively adaptable to a hamper or receptacle for determining when a metal object has been placed into the hamper or receptacle. The present invention also recognizes that this detection can be accomplished while ignoring or disregarding the presence of metal objects in the vicinity of the hamper or receptacle until such time as these objects are actually being placed into the hamper or receptacle. It is also recognized by the present invention that a metal detector can be provided which ignores certain non-ferrous metallic waste, such as aluminum wrapping, that is discarded into the receptacle. The present invention further recognizes that a metal detector can be provided which is easily moved with the receptacle and which can be easily maintained.

In light of the above, it is an object of the present invention to provide a metal detector which will detect the passage of a metal object through a predetermined space or passageway that is circumscribed by the detector. Another object of the present invention is to provide a metal detector which will disregard the passage of a nearby metal object unless the object passes through the passageway established by the detector. Yet another object of the present invention is to provide a metal detector which is sufficiently sensitive to detect the passage, through its passageway, of medical and surgical instruments while ignoring the passage of non-ferrous metal material such as aluminum wraps. Still another object of the present invention is to provide a metal detector which has a minimal number of components in order to simplify the maintenance and repair of the detector. Another object of the present invention is to provide a metal detector which is operatively adaptable to mobile hampers or receptacles. Still an additional object of the present invention is to provide a metal detector which is relatively easy to manufacture and which is cost effective.

SUMMARY OF THE INVENTION

A preferred embodiment of the novel device for detecting the passage of ferromagnetic objects through a predetermined space comprises a substantially circular base which defines and circumscribes the space through which passing metal objects are to be detected. An inner detector coil and an outer detector coil are concentrically mounted on the base in coplanarity. When a magnetic field is placed in motion relative to the coils, such as when a ferromagnetic object is dropped through the opening of the base, electrical voltages are induced in the coils. The resulting induced voltages on the coils are amplified, filtered, rectified, and processed by a circuit which is electrically coupled to the coils. The signal processing circuit compares the absolute value of the inner coil voltage signal to the absolute value of the outer coil voltage signal. In accordance with the logic of the present invention, the signal processing circuit generates a signal to indicate the passage of a metal object through the space circumscribed by the base whenever the absolute value of the signal from the inner detector exceeds the absolute value of the signal from the outer detector. An audio or visual alarm can be electrically connected to the signal processing circuit to indicate an occurence of the event wherein a ferromagnetic object passes through the space circumscribed by the base. An electrical timer is incorporated into the signal processing circuit to allow the circuit to sample and hold the voltage signals from the coils at their maximum value for a period sufficient to permit comparison of the signals.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 1 is a perspective view of the metal detector operatively positioned around the opening of a waste receptacle;

FIG. 2 is a top view of an alternative embodiment of the metal detector;

FIG. 3 is a cross-sectional view of the detector as seen along the line 2—2 in FIG. 1.

DESCRIPTION OF THE PREFERRED EMBODIMENT

Figure 4:
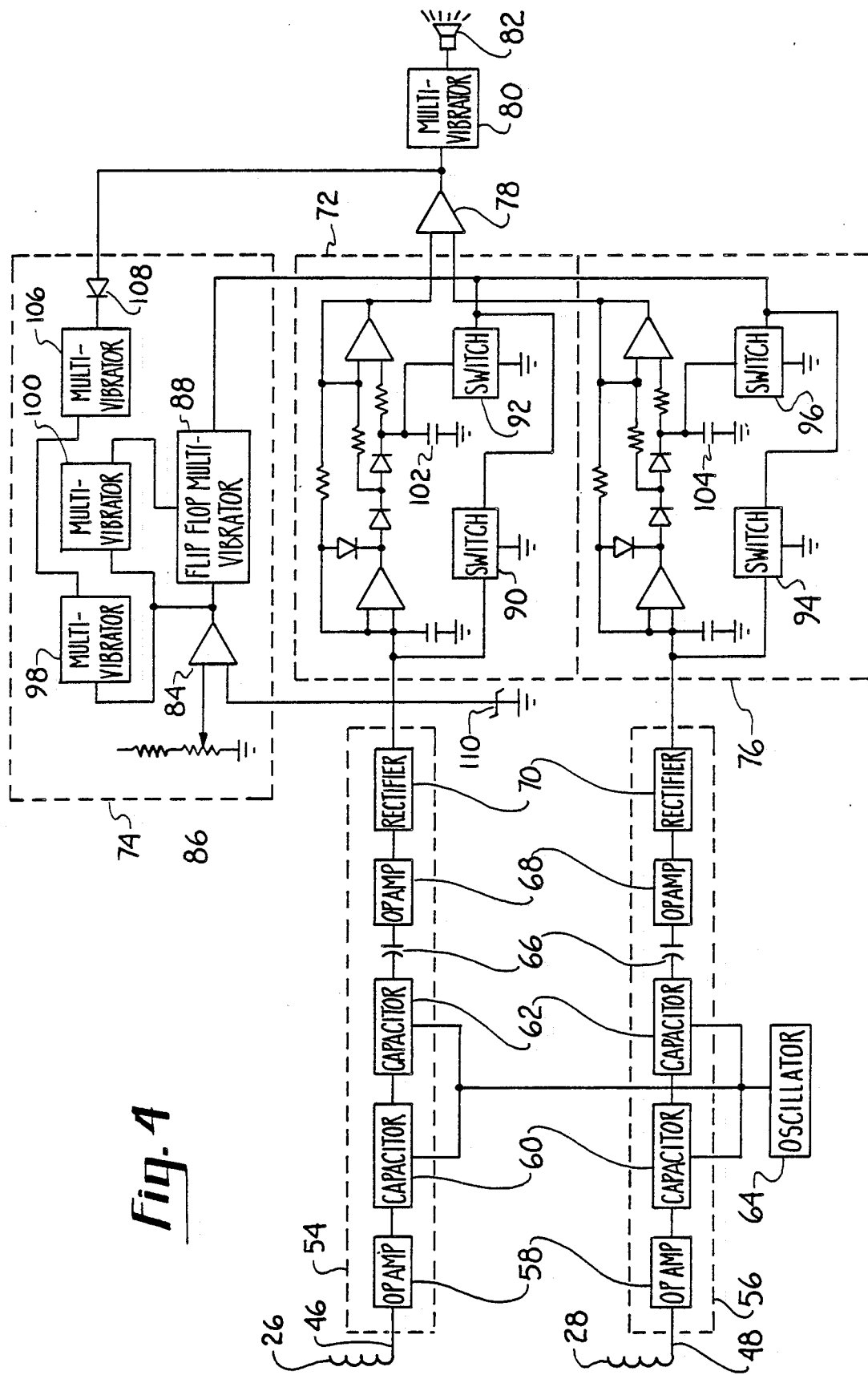
FIG. 4 is a functional block diagram of the electronic circuitry of the detector.

Referring initially to FIG. 1, the metal detector of the present invention, generally designated 10, is shown in its operative association with a receptacle 12. As shown, the opening 14 of receptacle 12 is uncovered. It will be understood, however, that a lid (not shown) can be provided which will cover opening 14 whenever desired.

FIG. 1 also shows that detector 10 comprises a base 16 which is formed with protrusions 18 and 20. As shown in phantom in FIG. 1, a direct current power supply case 22, for providing power to the electronic components of metal detector 10, is held in protrusion 18 of base 16 and an electronic component case 24 is held in protrusion 20 of base 16. Also shown in phantom in FIG. 1 are an inner detector coil 26 and an outer detector coil 28. As intended for the present invention the coils 26 and 28 are mounted on base 16 in coplanarity with inner detector coil 26 being nearest opening 14. Although base 16 can have any of several configurations, it is preferably circular. When so configured, the coils 26 and 28 will be both coplanar and concentric with respect to an axis which passes through the center of opening 14 and which is perpendicular to a plane containing the circular-shaped base 16. In the preferred embodiment of detector 10, base 16 circumscribes a passageway 30 which coincides with opening 14 of receptacle 12. It will be appreciated, however, that there are several combinations of physical variables for coils 26 and 28 which, when properly interrelated, may comprise an effective embodiment of metal detector 10. For example, shown in FIG. 2 is an alternative embodiment of the novel metal detector 10 which has a substantially oval-shaped opening 30, for use with non-circular containers 12. In addition to varying the shapes of coils 26 and 28, other physical variables of coils 26 and 28, such as number of turns and size, may be varied as appropriate for the particular application of metal detector 10.

Referring now to FIG. 3, it can be seen that base 16 is configured to rest on the lip 32 of receptacle 12. Specifically, by cross-referencing FIG. 1 and FIG. 3, it will be appreciated that a trash bag liner 34 can be placed into receptacle 12 and held there by the action of base 16 resting on lip 32. FIG. 3 also shows that base 16 comprises a cover 36 which is attached to a frame 38 by any means well known in the pertinent art, such as by solvent bonding. Additionally, a coil support 40 is held between cover 36 and frame 38. As will be appreciated by collectively considering FIGS. 1 and 3, coil support 40 extends completely around base 16 to circumscribe passageway 30. Further, coil support 40 establishes the surfaces 42 and 44 which respectively support inner detector coil 26 and outer detector coil 28. The radial distances between surfaces 42 and 44 can be varied somewhat according to the needs of the application, but preferably the distance between the surfaces 42 and 44 is on the order of approximately one (1.0) inch.

As best seen in FIG. 3, electrical components 50 of electrical component case 24 are electrically connected to coils 26 and 28 by lines 46 and 48, respectively. Repair or replacement of electronic components 50 and their associated elements can be easily accomplished by the removal of access panel 52.

Referring now to FIG. 4, the block diagram for the electrical components of detector 10 shows that inner detector coil 26 and outer detector coil 28 are electrically connected in parallel to signal processing loops 54 and 56, respectively. Coils 26 and 28 comprise any suitable conductor, such as copper. Loops 54 and 56 are constructed and function identically, with one exception which is noted below. It will therefore be understood that discussion of the signal processing of loop 54 will apply equally to the signal processing of loop 56. As shown in FIG. 4, coil 26 is electrically coupled via line 46 to operational amplifier 58 in processing loop 54. As is well known in the art, passage of a magnetic field nearby coil 26, such as may occur when a ferromagnetic object is placed in relative motion to coil 26, induces a voltage on coil 26. Operational amplifier 58 in processing loop 54 amplifies the relatively small induced voltage signal from coil 26 to produce an output signal having an approximate electrical gain of one thousand (1000). In the embodiment shown, operational amplifier 58 is a low noise amplifying device, such as the device manufactured by Linear Technology, component designation OP-27.

Operational amplifier 58 is connected in series to low pass frequency filters 60 and 62. Frequency filters 60 and 62 are selected to pass only that portion of the signal from operational amplifier 58 that has a frequency below approximately 20 Hz. It will be appreciated that frequency filters 60 and 62 thus substantially block signal noise which may be induced in coil 26 by electrical components in the vicinity of metal detector 10, such as 60 Hz lighting. It will be further appreciated that connecting frequency filters 60 and 62 in series logarithmically doubles the noise-attenuating effect of a single frequency filter to result in more efficacious filtering of unwanted system noise. In one embodiment of metal detector 10, frequency filters 60 and 62 are MF6 Butterworth switched capacitor Lowpass Filters, manufactured by National Semiconductor Corporation. As shown next in FIG. 4, oscillator 64 is electrically coupled to frequency filters 60 and 62 to provide 1000 Hz clocking to the frequency filters 60 and 62. The output of frequency filters 60 and 62 is then passed through two additional filtering devices connected in series. The first filtering device is capacitor 66, which blocks any direct current offset added to the loop signal by frequency filters 60 and 62. In the preferred embodiment, capacitor 66 is a 2.2 micro farad capacitor. The resulting alternating current-only signal at the output of capacitor 66 is further filtered by an operational amplifier 68 which is compensated to block 1000 Hz noise added to the loop signal by oscillator 64.

The filtered signal from operational amplifier 68 is next electrically coupled to full wave rectifier 70, which may be comprised of any suitable precision rectifying device known in the art. For both processing loop 54 and processing loop 56 the respective full wave rectifier 70 reverses the polarity of the negative portion of the signal exiting operational amplifiers 68 to respectively provide a fully rectified signal to peak voltage detectors 72 and 76. Additionally, processing loop 54 feeds timing circuit 74, which is in turn connected in parallel to peak voltage detector 72 as shown in FIG. 4. Timing circuit 74 controls both the processing of the loop 54 signal through peak voltage detector 72, and the processing of the loop 56 signal through peak voltage detector 76. The operation of timing circuit 74 and the signal processing of peak voltage detectors 72 and 76 are more fully disclosed below. The signals processed by peak voltage detectors 72 and 76 are compared by voltage comparator 78. When the magnitude of the signal from inner detector loop 54 is greater than the magnitude of the signal from outer detector loop 56, indicating passage of a ferromagnetic object through passageway 30, comparator 78 causes monostable multivibrator 80 to change state. When monostable multivibrator 80 changes state, alarm 82 is activated to alert hospital personnel that a ferromagnetic object has been discarded into receptacle 12. Voltage comparator 78 may comprise any suitable comparator device, such as a suitably biased LM 339 comparator manufactured by National Superconductor Corporation. Similarly, monostable multivibrator 80, like the other monostable multivibrators used in metal detector 10, may comprise any suitable device known in the art, such as a type MC 14538B monostable multivibrator, which is manufactured by the Motorola Corporation.

OPERATION

In its operation, the detector 10 is placed in position to circumscribe the opening 14 of a receptacle 12. This places the passageway 32 that is formed through base 16 into a position where metal detector 10 can detect when ferromagnetic objects have passed through passageway 32 and into the receptacle 12. To do this, an inner detector coil 26 is electrically coupled via line 46 with the inner signal processing loop 54 and is positioned between an outer detector coil 28 and passageway 32 to establish a first detector. Likewise, an outer detector coil 28 is electrically coupled via line 48 to outer signal processing loop 56 and is positioned in coplanarity outside inner detector coil 26 to establish a second detector. With this configuration, the first and second detectors will independently generate voltage signals whose magnitude is indicative of the proximity of a metal object to the particular detector.

In order to more clearly understand the operation of metal detector 10 on the component level when a magnetic field passes nearby, reference is made to FIG. 4. As discussed above, when a ferromagnetic object passes nearby metal detector 10, the amplified induced voltage signals from the coils 26 and 28 are filtered and rectified by signal processing loops 54 and 56, respectively. After this initial processing, the signal from loop 54 enters comparator 84 of timing circuit 74. If loop 54 signal voltage exceeds comparator 84 reference voltage, established by appropriately adjusting potentiometer 86, comparator 84 triggers flip-flop 88 to change to its set state, familiarly known in the art as its "1" state. Flip-flop 88 in turn opens normally closed analog switches 90, 92, 94 and 96 to enable signals from processing loops 54 and 56 to pass through peak voltage detector loops 72 and 76, respectively. Simultaneous with the opening of switches 90, 92, 94 and 96, flip-flop 88, when triggered, also triggers monostable multivibrators 98 and 100 to change to their unstable states. Multivibrator 98 remains in its unstable state for a period that is sufficiently long enough to allow the voltage signals of peak voltage detector loops 72 and 76 to reach peak values, before multivibrator 98 resets to its stable state. In the preferred embodiment, multivibrator 98 remains in its unstable state for approximately one-half second to allow voltage signals in loops 72 and 76 sufficient time to peak as a ferromagnetic object passes through or in close proximity to . passageway 30. The peak values of loops 72 and 76 are sampled and held in turn by capacitors 102 and 104, respectively. As will be appreciated by the skilled artisan, capacitors 102 and 104, respectively, track the applied voltages from the loops 72 and 76 by accumulating a charge which is proportional to the highest voltage placed across the capacitors 102 and 104.

After the timing period of multivibrator 98 has elapsed, multivibrator 98 shifts back to its stable state. As seen in FIG. 4, however, multivibrator 98 is not enabled to commence a new timing cycle until multivibrator 100 enables multivibrator 98, as more fully disclosed below. As multivibrator 98 shifts to its stable state, multivibrator 98 triggers monostable multivibrator 106 to shift to its unstable state, which signals comparator 80 to sample the respective peak voltages held by capacitors 102 and 104. If the peak voltage held by capacitor 104 exceeds the peak voltage held by capacitor 102, indicating passage of a magnetic field without passageway 30, comparator 78 output tends to be low, or negative. It will be appreciated that in this event, diode 108 will prevent the triggering of monostable multivibrator 80 and subsequent activation of alarm 82, as further disclosed below.

Conversely, if the voltage held by capacitor 102 exceeds the voltage held by capacitor 104, indicating passage of a magnetic field through passageway 30, comparator 78 output is high, or positive. In this event, the signal from comparator 78 triggers multivibrator 80 to shift to its unstable state for a predetermined alarm period to activate alarm 82 as disclosed below.

Upon completion of the peak voltage sampling period, which, in the preferred embodiment, is approximately two tenths of a second, multivibrator 100 resets to its stable state. As it does so, it causes flip-flop 88 to reset, and enables monostable multivibrator 98 for subsequent detection events. When flip-flop 88 resets, it also causes switches 90, 82, 94 and 96 to close, discharging the capacitors 102, 104, and placing the electrical circuitry of metal detector 10 in standby for subsequent detection events.

Also seen in FIG. 4 is zener diode 110, which is connected to ground between signal processing loop 54 and peak voltage detector loop 72. An analogous provision is not made in signal processing loop 56. As the skilled artisan will therefore appreciate, zener diode 110 functions to clamp the inner detector loop voltage signal present on loop 54 to the zener diode breakdown voltage in the event that both the inner coil signal processing loop 54 and outer coil signal processing loop 56 are saturated. Such a saturation event may be caused, for example, by passing a heavy magnet nearby metal detector 10. In such an event, it will be appreciated that the voltage clamping performed by zener diode 110 prevents spurious false alarms from being generated by metal detector 10 by ensuring that outer loop 56 voltage will be sensed by comparator 78 as exceeding inner loop 54 voltage.

In light of the above disclosures, it will be appreciated that when ferromagnetic objects pass through passageway 30 they are nearer to inner detector coil 26 than they are to outer detector coil 28. Consequently, the inner coil 26 will generate a voltage signal whose absolute value is greater than the corresponding signal from the outer coil 28. This allows the determination that a metal object has passed through the passageway 30. On the other hand, metal objects which are outside base 16, and hence not in passageway 30, cause the outer coil 28 to generate a signal of greater absolute value than the corresponding signal from the inner coil 26. This will be so as long as the ferromagnetic object is closest to the outer coil 28 and regardless of how close this might be. By using a comparator to sense the relative magnitudes of the signals generated by its inner and outer coils, the detector 10 can ignore the presence of metal objects that are only near the detector 10 while also providing an alarm to tell the operator whenever a metal object has passed through the passageway 30.

While the particular metal detector as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A ferromagnetic object detector which comprises:
   a base;
   a first detecting coil defining a passageway and mounted on said base for generating a first electrical signal when a magnetic object is passed near said first detector;
   a second detecting coil surrounding said first detecting coil and mounted on said base for generating a second electrical signal when a magnetic object is passed near said second detecting coil;
   means electrically connected to said coils for comparing said first and second signals to indicate the passage of said object through said passageway; and
   timing means electrically connected to said comparing means for electrically isolating said comparing means from said coils for a predetermined period of time to permit said first and second signals to increase to a respective maximum value before the maximum value of said first signal is compared with the maximum value of said second signal by said comparing means.

2. A ferromagnetic object detector as recited in claim 1 further comprising:
   a plurality of frequency filters electrically connected between said coils and said comparing means for filtering signals from sources other than said object from said comparison means; and
   a plurality of monostable multivibrators and an electronic flip-flop electrically connected between said frequency filters and said comparing means for establishing said timing period.

3. A ferromagnetic object detector as recited in claim 2 wherein said comparing means further comprises an electronic comparator, said comparator being responsive to the difference between said first signal and said second signal to indicate passage of said object through said passageway when the difference between said first signal and said second signal is positive.

4. A ferromagnetic object detector as recited in claim 1 where said coils are substantially coplanar.

5. A ferromagnetic object detector as recited in claim 1 wherein said base is substantially circular and said coils are substantially concentric.

6. A ferromagnetic object detector as recited in claim 1 further comprising a receptacle for engaging said base to collect objects which pass through said passageway and into said receptacle.

7. A ferromagnetic object detector as recited in claim 1 further comprising means electrically coupled with said comparison means to alarm when said object passes through said passageway.

8. A ferromagnetic object detector as recited in claim 1 further comprising a direct current power source for energizing said comparison means.

9. A ferromagnetic object detector as recited in claim 1 wherein said base is substantially oval-shaped.

10. A metal object detector which comprises:
    a base defining a passageway therethrough;
    a first detecting coil mounted on said base for generating a first signal having an absolute value in response to the proximate passage of said metal object;
    a second detecting coil mounted on said base with said first detecting coil between said second detecting coil and said passageway for generating a second signal having an absolute value in response to the proximate passage of said object; and
    means electrically connected to aid coils for comparing said absolute values of said signals to indicate the passage of said object through said passageway; and
    timing means electrically connected to said comparing means for electrically isolating and comparing means from said coils for a predetermined period of time to permit said first and second signals to increase to a respective maximum value before the maximum value of said first signal is compared with the maximum value of said second signal by said comparing means.

11. A metal object detector as recited in claim 10 further comprising:
    a plurality of frequency filters electrically connected between said coils and said comparing means for filtering signals from sources other than said object from said comparison means; and
    a plurality of monostable multivibrators and an electronic flip-flop electrically connected between said frequency filters and said comparing means for establishing said timing period.

12. A metal object detector as recited in claim 11 wherein said comparison means further comprises a comparator, said comparator being responsive to the difference between said first signal and said second signal to indicate passage of said object through said passageway when the difference between said first signal and said second signal is positive.

13. A metal object detector as recited in claim 10 where said coils are substantially coplanar.

14. A metal object detector as recited in claim 10 wherein said base is substantially circular and said coils are substantially concentric.

15. A metal object detector as recited in claim 10 further comprising a receptacle for engaging said base to collect objects which pass through said passageway and into said receptacle.

16. A metal object detector as recited in claim 10 further comprising means electrically coupled with said comparison means to alarm when said object passes through said passageway.

17. A metal object detector as recited in claim 10 further comprising a direct current power source for energizing said comparison means.

18. A ferromagnetic object detector as recited in claim 10 wherein said base is substantially oval-shaped.

19. A ferromagnetic object detector which comprises:
- a first inductive coil forming an opening;
- a second inductive coil disposed outside and concentrically around said first coil;
- means electrically connected to said coils for comparing the magnitudes of the induced voltages formed on said coils when said object is passed nearby said coils to determine the passage of said object through said opening; and
- timing means electrically connected to said comparing means for electrically isolating said comparing means from said coils for a predetermined period of time to permit said first and second voltages to increase to a respective maximum value before the maximum value of said first voltage is compared with the maximum value of said second voltage by said comparing means.

20. A ferromagnetic object detector as recited in claim 19 further comprising:
- a plurality of electronic frequency filters electrically connected between said coils and said comparing means for filtering voltages from sources other than said object from said comparison means; and
- a plurality of monostable multivibrators and an electronic flip-flop electrically connected between said frequency filters and said comparing means for establishing said timing period.

21. A ferromagnetic object detector as recited in claim 20 wherein said comparison means further comprises an electronic comparator, said comparator being responsive to the difference between said first voltage and said second voltage to indicate passage of said object through said opening when the difference between said first voltage and said second voltage is positive.

22. A ferromagnetic object detector as recited in claim 19 where said coils are substantially coplanar.

23. A ferromagnetic object detector as recited in claim 19 wherein said opening is substantially circular and said coils are substantially concentric.

24. A ferromagnetic object detector as recited in claim 19 further comprising a receptacle for engaging said base to collect objects which pass through opening and into said receptacle.

25. A ferromagnetic object detector as recited in claim 19 further comprising means electrically coupled with said comparison means to alarm when said object passes through said opening.

26. A ferromagnetic object detector as recited in claim 19 further comprising a direct current power source for energizing said comparison means.

27. A ferromagnetic object detector as recited in claim 19 wherein said opening is substantially oval-shaped.

28. A method for detecting the passage of objects having a permanent magnetic field, comprising the steps of:
- mounting a first inductive coil forming an opening on a base;
- mounting a second inductive coil concentric with said first inductive coil on said base, said first and second coils being substantially coplanar;
- passing said object nearby said coils to induce electrical voltages on said coils;
- sensing said induced voltages for a predetermined time period to determine the maximum magnitudes of said voltages; and
- comparing said maximum magnitudes of said induced voltages to determine the passage of said objects through said opening.

* * * * *